United States Patent
Gabriel et al.

(10) Patent No.: US 6,448,654 B1
(45) Date of Patent: Sep. 10, 2002

(54) ULTRA THIN ETCH STOP LAYER FOR DAMASCENE PROCESS

(75) Inventors: Calvin T. Gabriel, Cupertino; Lynne A. Okada, Sunnyvale, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/770,468

(22) Filed: Jan. 29, 2001

(51) Int. Cl.[7] .............................................. H01L 23/48
(52) U.S. Cl. ...................................................... 257/758
(58) Field of Search ................................ 257/758, 752; 438/622, 118, 690–693, 687, 627, 758, 784

(56) References Cited

U.S. PATENT DOCUMENTS

| | | | | |
|---|---|---|---|---|
| 6,037,664 A | * | 3/2000 | Zhao et al. | 257/758 |
| 6,165,891 A | * | 12/2000 | Chooi et al. | 438/622 |
| 6,235,628 B1 | * | 5/2001 | Wang et al. | 438/638 |

* cited by examiner

*Primary Examiner*—David Nelms
*Assistant Examiner*—Long K. Tran
(74) *Attorney, Agent, or Firm*—McDermott, Will & Emery

(57) ABSTRACT

A metal interconnect structure and method of making the same provides an ultra thin etch stop layer employed in conjunction with low k dielectric layers. The thinness of the etch stop layer allows higher k dielectric materials to be used as the etch stop material without increasing the overall k value of the dielectric layer/etch stop layer combination.

12 Claims, 3 Drawing Sheets

ULTRA THIN ETCH STOP LAYER FOR DAMASCENE PROCESS

FIELD OF THE INVENTION

The present invention relates to the manufacturing of semiconductor devices, and more particularly, to copper and copper alloy metallization in semiconductor devices.

BACKGROUND OF THE INVENTION

The escalating requirements for high density and performance associated with ultra large scale integration (ULSI) semiconductor device wiring are difficult to satisfy in terms of providing sub-micron-sized, low resistance-capacitance (RC) metallization patterns. This is particularly applicable when the sub-micron-features, such as vias, contact areas, lines, trenches, and other shaped openings or recesses have high aspect ratios (depth-to-width) due to miniaturization.

Conventional semiconductor devices typically comprise a semiconductor substrate, usually of doped monocrystalline silicon (Si), and a plurality of sequentially formed inter-metal dielectric layers and electrically conductive patterns. An integrated circuit is formed therefrom containing a plurality of patterns of conductive lines separated by inter-wiring spacings, and a plurality of interconnect lines, such as bus lines, bit lines, word lines and logic interconnect lines. Typically, the conductive patterns of vertically spaced metallization levels are electrically interconnected by vertically oriented conductive plugs filling via holes formed in the inter-metal dielectric layer separating the metallization levels, while other conductive plugs filling contact holes establish electrical contact with active device regions, such as a source/drain region of a transistor, formed in or on a semiconductor substrate. Conductive lines formed in trench-like openings typically extend substantially parallel to the semiconductor substrate. Semiconductor devices of such type according to current technology may comprise five or more levels of metallization to satisfy device geometry and microminiaturization requirements.

A commonly employed method for forming conductive plugs for electrically interconnecting vertically spaced metallization levels is known as "damascene" type processing. Generally, this process involves forming a via opening in the inter-metal dielectric layer or interlayer dielectric (ILD) between vertically spaced metallization levels. The via hole is subsequently filled with metal to form a via electrically connecting the vertically spaced apart metal features. The via opening is typically formed using conventional photolithographic and etching techniques. After the via opening is formed, the via is filled with a conductive material, such as tungsten (W), using conventional techniques, and the excess conductive material on the surface of the inter-metal dielectric layer is then typically removed by chemical mechanical planarization (CMP).

A variant of the above-described process, termed "dual damascene" processing, involves the formation of an opening having a lower contact or via opening section which communicates with an upper trench section. The opening is then filled with a conductive material to simultaneously form a contact or via in contact with a conductive line. Excess conductive material on the surface of the inter-metal dielectric layer is then removed by CMP. An advantage of the dual damascene process is that the contact or via and the upper line are formed simultaneously.

High performance microprocessor applications require rapid speed of semiconductor circuitry, and the integrated circuit speed varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. If the interconnection node is routed over a considerable distance, e.g., hundreds of microns or more, as in sub-micron technologies, the interconnection capacitance limits the circuit node capacitance loading and, hence, the circuit speed. As integration density increases and feature size decreases, in accordance with sub-micron design rules, the rejection rate due to integrated circuit speed delays significantly reduces manufacturing throughput and increases manufacturing costs.

One way to increase the circuit speed is to reduce the resistance of a conductive pattern. Conventional metallization patterns are typically formed by depositing a layer of conductive material, notably aluminum (Al) or an alloy thereof, and etching, or by damascene techniques. Al is conventionally employed because it is relatively inexpensive, exhibits low resistivity and is relatively easy to etch. However, as the size of openings for vias/contacts and trenches is scaled down to the sub-micron range, step coverage problems result from the use of Al. Poor step coverage causes high current density and enhanced electromigration. Moreover, low dielectric constant polyamide materials, when employed as inter-metal dielectric layers, create moisture/bias reliability problems when in contact with Al, and these problems have decreased the reliability of interconnections formed between various metallization levels.

One approach to improved interconnection paths in vias involves the use of completely filled plugs of a metal, such as W. Accordingly, many current semiconductor devices utilizing VLSI (very large scale integration) technology employ Al for the metallization level and W plugs for interconnections between the different metallization levels. The use of W, however, is attendant with several disadvantages. For example, most W processes are complex and expensive. Furthermore, W has a high resistivity, which decreases circuit speed. Moreover, Joule heating may enhance electromigration of adjacent Al wiring. A further problem is that W plugs are susceptible to void formation, and the interface with the metallization level usually results in high contact resistance.

Another attempted solution for the Al plug interconnect problem involves depositing Al using chemical vapor deposition (CVD) or physical vapor deposition (PVD) at elevated temperatures. The use of CVD for depositing Al is expensive, and hot PVD Al deposition requires very high process temperatures incompatible with manufacturing integrated circuitry.

Copper (Cu) and Cu-based alloys are particularly attractive for use in VLSI and ULSI semiconductor devices, which require multi-level metallization. Cu and Cu-based alloy metallization systems have very low resistivities, which are significantly lower than W and even lower than those of previously preferred systems utilizing Al and its alloys. Additionally, Cu has a higher resistance to electromigration. Furthermore, Cu and its alloys enjoy a considerable cost advantage over a number of other conductive materials, notably silver (Ag) and gold (Au). Also, in contrast to Al and refractory-type metals (e.g., titanium (Ti), tantalum (Ta) and W), Cu and its alloys can be readily deposited at low temperatures formed by well-known "wet" plating techniques, such as electroless and electroplating techniques, at deposition rates fully compatible with the requirements of manufacturing throughput.

Another technique to increase the circuit speed is to reduce the capacitance of the inter-metal dielectric layers. Dielectric materials such as silicon oxide ($SiO_2$) have been commonly used to electrically separate and isolate or insulate conductive elements of the integrated circuit from one another. However, as the spacing between these conductive elements in the integrated circuit structure has become smaller, the capacitance between such conductive elements because of the dielectric being formed from silicon oxide is more of a concern. This capacitance negatively affects the overall performance of the integrated circuit because of increased power consumption, reduced speed of the circuitry, and cross-coupling between adjacent conductive elements.

A response to the problem of capacitance between adjacent conductive elements caused by use of silicon oxide dielectrics has led to the use of other dielectric materials, commonly known as low-k dielectrics. Whereas silicon oxide has a dielectric constant of approximately 4.0, many low-k dielectrics have dielectric constants less than 3.5. Examples of low-k dielectric materials include organic or polymeric materials. Another example is porous, low density materials in which a significant fraction of the bulk volume contains air, which has a dielectric constant of approximately 1. The properties of these porous materials are proportional to their porosity. For example, at a porosity of about 80%, the dielectric constant of a porous silica film, i.e. porous $SiO_2$, is approximately 1.5. Still another example of a low-k dielectric material is carbon doped silicon oxide wherein at least a portion of the oxygen atoms bonded to the silicon atoms are replaced by one or more organic groups such as, for example, an alkyl group such as a methyl ($CH_3$—) group.

FIG. 1 shows a cross-section of a metal interconnect portion formed in accordance with prior art methods of processing. A bottom etch stop layer 11 is formed on a substrate 10. The bottom etch stop layer 11 may be made of a number of different materials, such as silicon nitride or silicon carbide. The thickness of the bottom etch stop layer 11 is typically greater than 500 Angstroms in order to provide sufficient etch stop capability. Besides being a diffusion barrier for substrate 10, the bottom etch stop layer 11 serves to protect the substrate 10 from damage during the etching process.

A first dielectric layer 12, which may comprise low k dielectric material, is formed over the bottom etch stop layer 11. A middle etch stop layer 14, which may also comprise silicon nitride or silicon carbide, for example, is formed on the first dielectric layer 12. The thickness of this layer 14 is also greater than 500 Angstroms in order to provide sufficient material to protect the underlying first dielectric layer 12. The pattern of a via is formed in the middle etch stop layer 14. A second dielectric layer 16 is then formed on top of the patterned middle etch stop layer 14. Using conventional photolithography and etching techniques, a second feature is etched in the second dielectric layer 16. This second feature may be a trench, for instance. The etching continues through the pattern opening in the middle etch stop layer 14 and through the first dielectric layer 12, stopping on the bottom etch stop layer 11. Following the etching of the first and second dielectric layers 12, 16, the bottom etch stop layer 11 is etched within the via opening, thereby exposing the substrate 10. Conductive material is then filled within the openings created in the first and second dielectric layers 12, 16 to form a conductive line 18 connected to a conductive via 20. The conductive material may be copper or a copper alloy, for example. When copper is used, typically a barrier metal and a seed layer are deposited prior to the deposition of the copper.

One of the problems associated with the above-described processes and structure in the prior art is the limited choices of material for the middle etch stop layer, layer 14 in FIG. 1. The material needs to be etch resistant. A very commonly used material as an etch stop is silicon nitride, which has a dielectric constant of about 7.5. However, the use of the thick etch stop layer of silicon nitride, needed to assure that the etching will stop on the middle etch stop layer, in conjunction with the low k dielectric layer, partially negates the benefits obtained by the use of low k dielectric material. This is due to the increased combined capacitance of the etch stop layer and the dielectric layer. The same reasoning holds true for the bottom etch stop layer 11 in prior art FIG. 1.

Focus in the industry has therefore recently been turned to avoiding stop layers or employing stop layers with lower k values than silicon nitride. For example, silicon carbide, with a k value of about 4 to 5, is one of the most frequently considered films. However, films with lower k values typically do not function as well in the role of an etch stop as they etch too fast. The films are therefore made thicker to compensate for the lower etch resistance of the film material. But making the film thicker increases the overall capacitance, which is roughly proportional to the k value multiplied by the thickness of the layer. Hence, increasing the thickness to provide adequate etch stop protection in order to employ a lower k value film at least partially negates the benefits sought in selecting a lower k film to be the etch stop.

SUMMARY OF THE INVENTION

There is a need for an improved method of forming a metal interconnect structure that exhibits an improved combined dielectric constant for the dielectric layers and etch stop layers.

This and other needs are met by embodiments of the present invention which provide an interconnect arrangement comprising a first layer, and an etch stop layer on the first layer. This etch stop layer has a thickness that is less than approximately 500 Angstroms. A dielectric layer is provided on the etch stop layer.

By providing an etch stop layer that is less than 500 Angstroms, higher k materials may be employed that are more etch resistant than moderate k materials currently used in damascene processing. Since these higher k materials are more etch resistant, a thinner layer than conventionally used may be employed in the etch stop layers. At the same time, however, the overall dielectric constant of the combined low k dielectric layer and etch stop layer may be improved, despite the use of etch stop material that is higher in dielectric constant value, when only a thin etch stop layer is employed.

The earlier stated needs are also met by other aspects of the present invention which include a method of forming a metal interconnect arrangement comprising the steps of forming an etch stop layer on a first layer to a thickness of less than 500 Angstroms, and forming a top dielectric layer on the etch stop layer.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses problems related to the use of etch stop layers that are made of materials that do not make very effective etch stops, such as silicon oxynitride, but have moderate k values that aid in keeping the combined dielectric constant relatively low. These problems are solved, in part, by the present invention which provides an ultra thin etch stop layer for use in a damascene processing technique with low k dielectric materials. The thickness of the ultra thin etch stop layer is less than approximately 500 Angstroms. Due to its ultra thin thickness, a middle etch stop layer comprising a more effective etch stop material, such as alumina, titanium dioxide, etc., can be used in a via-first, trench-last damascene integration scheme without severely impacting the combined dielectric constant of the etch stop layer and dielectric layer.

Figure 1:
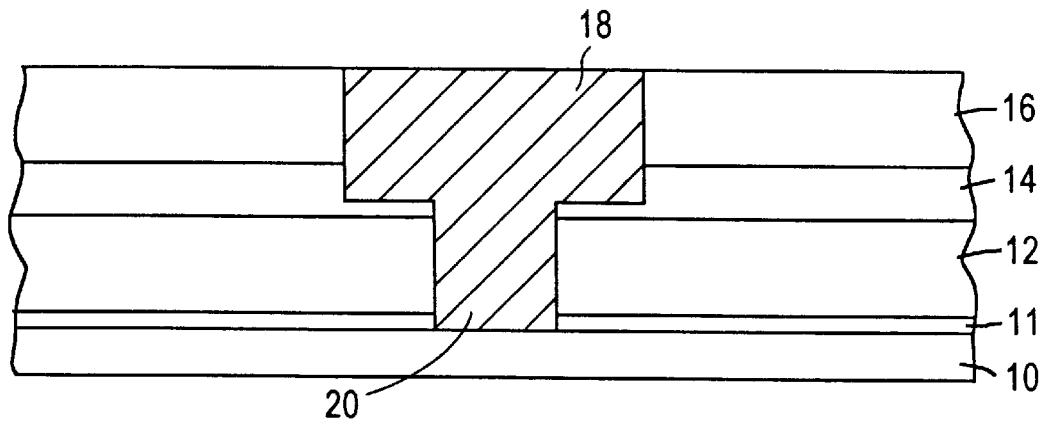
FIG. 1 is a cross-section of a metal interconnect portion of a semiconductor device formed in accordance with prior art methodologies.
Figure 2:
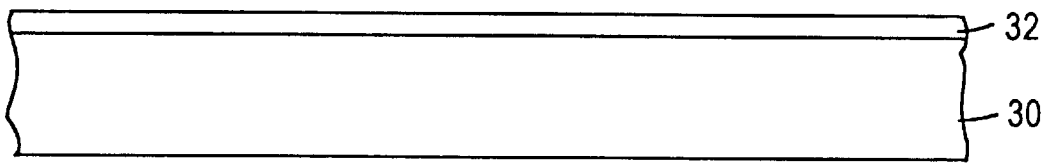
FIG. 2 is a cross-section of a metal interconnect portion during one step of a formation process.

FIG. 2 depicts a cross-section of a portion of a metal interconnect structure formed in accordance with embodiments of the present invention. A substrate 30, which may be another metallization layer or a device layer, for example, is provided. A bottom etch stop layer 32 is deposited on the substrate 30. The thickness is ultra thin, i.e., less than 500 Angstroms, in preferred embodiments of the present invention. By employing an ultra thin bottom etch stop layer 32, a more etch resistant material may be used without severely impacting the combined dielectric constant of the bottom etch stop layer 32 in the subsequently formed dielectric layer. Hence, the present invention provides improved etch resistance in comparison to other materials such as silicon oxynitride, but does not overly increase the combined dielectric constant of the structure. These other materials include amorphous silicon, a ceramic such as alumina, calcium fluoride, calcium carbonate, titanium dioxide, or diamond, etc. Depending on the etch resistance of the selected material, the bottom etch stop layer 32 may be made even thinner. For example, the bottom etch stop layer 32 may be 200 Angstroms or less, or 100 Angstroms or less, or 50 Angstroms. The smaller the thickness of the bottom etch stop layer 32, the higher the k value of the material comprising the bottom etch stop layer 32 may be increased.

The bottom etch stop layer 32 is deposited on the substrate 30 by conventional methodologies, such as physical vapor deposition, chemical vapor deposition, sputtering, plasma enhanced chemical vapor deposition, etc. The controlling of the deposition thickness is readily achieved by one of ordinary skill in the art. Plasma enhanced chemical vapor deposition is preferred to produce ultrathin films.

Figure 3:
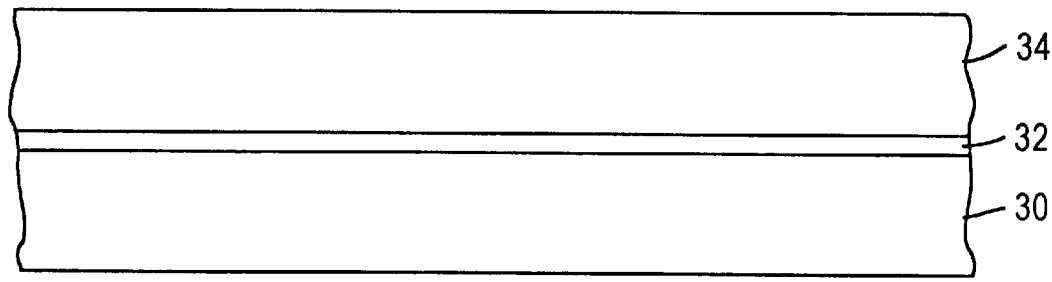
FIG. 3 shows a portion of FIG. 2 after a first dielectric layer has been deposited over a bottom etch stop layer.

Following the formation of the bottom etch stop layer 32 on the substrate 30, a first dielectric layer 34 is formed on the bottom etch stop layer 32, as seen in FIG. 3. In preferred embodiments of the invention, the first dielectric layer 34 is a low k dielectric layer comprising low k dielectric material. The low k dielectric material may be any of a number of different types of materials, such as organic low k dielectric materials or inorganic low k dielectric materials. Examples of organic low k dielectric materials include benzocyclobutene (BCB), SiLK, FLARE, etc. Examples of inorganic low k dielectric materials include methyl silsesquioxane (MSQ), hydrogen silsesquioxane (HSQ), SiOF, etc. Conventional methodologies for forming the low k dielectric layer 34 may be employed.

In certain embodiments of the present invention, the low k dielectric layer 34 is then etched to form features that are then filled with conductive material to form conductive structures. In other embodiments of the invention, described further with respect to FIGS. 4–9, a multi-layered dual damascene structure is provided.

Figure 4:
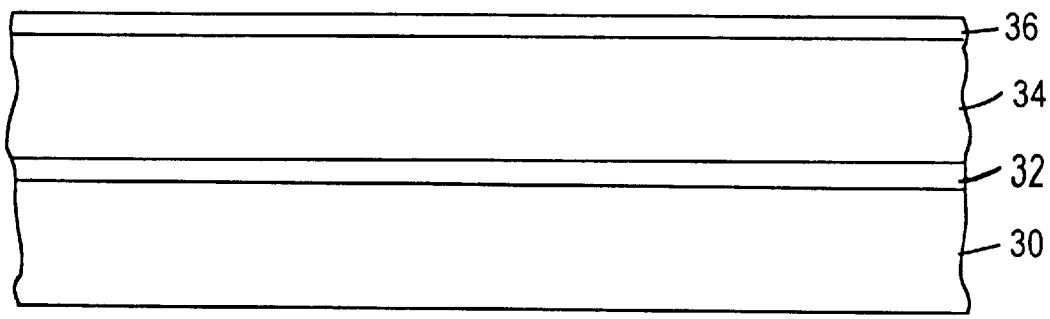
FIG. 4 shows the structure of FIG. 3 following the deposition of a middle etch stop layer having a thickness provided in accordance with embodiments of the present invention.

In FIG. 4, a middle etch stop layer 36 is deposited on the first dielectric layer 34. Middle etch stop layer 36, in accordance with embodiments of the present invention, has a thickness of less than 500 Angstroms. The material may be the same as the material in the bottom etch stop layer 32. The ultra thin middle etch stop layer 36 allows materials with greater etch resistance, albeit higher k values, to be employed to improve the etching process. In spite of the use of etch stop material that has a higher k value, the combined k value of the first dielectric layer 34 and the middle etch stop layer 36 is not substantially increased in comparison to prior art arrangements that employ a thicker etch stop layer comprising moderate k material. As exemplary materials, amorphous silicon, alumina, etc. may be employed as the middle etch stop layer 36. An especially preferred thickness for such materials is approximately 200 Angstroms or less. For materials that have even greater etch resistances, even thinner middle etch stop layers 36 may be employed, such as between about 50 and about 100 Angstroms thick. This will improve the combined k value of the middle etch stop layer 36 and the first dielectric layer 34.

Figure 5:
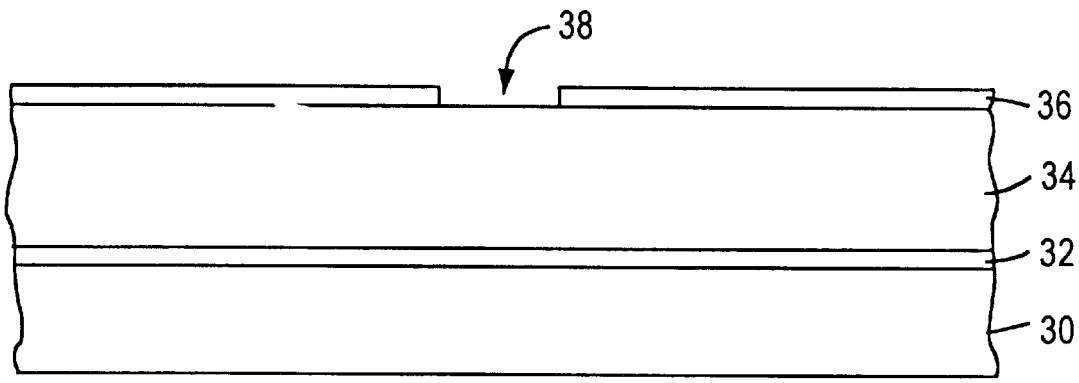
FIG. 5 shows the portion of FIG. 4 after the patterning of a feature within the middle etch stop layer, in accordance with embodiments of the present invention.

FIG. 5 depicts the structure of FIG. 4 after a feature opening 38 has been etched into the middle etch stop layer 36. This is performed by conventional photolithographic and etching techniques. The etching is stopped at the first dielectric layer 34. The feature opening 38 may be a via pattern that will be transferred into the first dielectric layer 34. Following the patterning of the feature opening 38, the photoresist material employed in the patterning process is removed.

Figure 6:
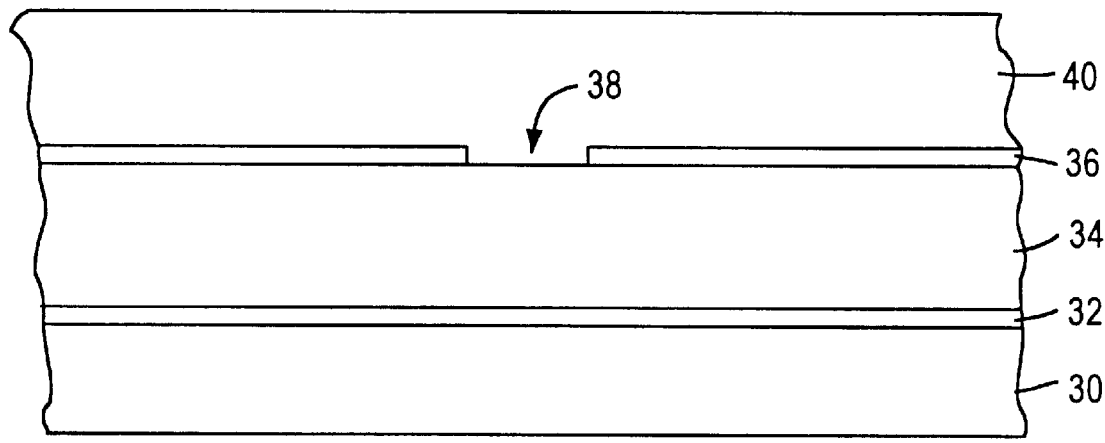
FIG. 6 shows the structure of FIG. 5 after a second dielectric layer has been deposited over the patterned middle etch stop layer in accordance with embodiments of the present invention.
Figure 7:
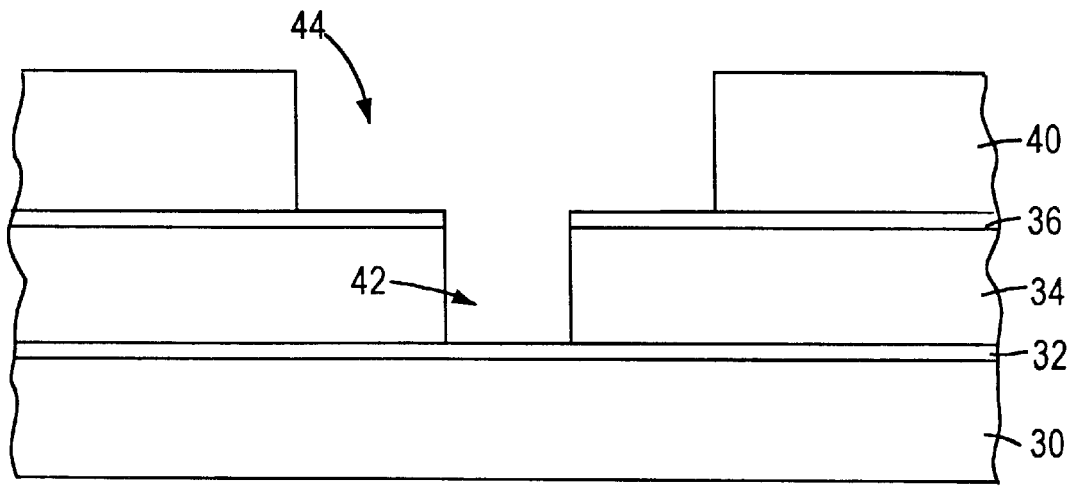
FIG. 7 shows the structure of FIG. 6 after a pattern has been etched into the top dielectric layer and the pattern in the middle etch stop layer has been transferred into the first dielectric layer, in accordance with embodiments of the present invention.

In FIG. 6, a second dielectric layer 40 is deposited over the patterned middle etch stop layer 36. In preferred embodiments of the invention, the second dielectric layer 40 is also a low k dielectric layer. The dielectric material may be the same as that of the first dielectric layer 34, thereby allowing a single etching step to etch both the second dielectric layer 40 and the first dielectric layer 34. The interconnect arrangement is then subjected, as depicted in FIG. 7, to another etching step that etches a feature opening 44 into the second dielectric layer 40. At the same time, the feature 38 patterned into the middle etch stop layer 36 is etched into the first dielectric layer 34 as a via hole 42. The etching stops at the bottom etch stop layer 32. The feature opening 44 may be a trench, for example. Conventional photolithographic and etching techniques may be employed to etch the first and second dielectric layers 34, 40. The middle etch stop layer 36 prevents unintentional etching of the trench feature into the first dielectric layer 34. Hence, a via hole 42 may be created in the first dielectric layer 34 at the same time that a trench 44 may be created in the second dielectric layer 40. The middle etch stop layer 36 provides greater etching control due to the ability to use more etch resistant material than other materials commonly used as etch stop layers, such as silicon oxynitride or silicon carbide. However, since the thickness of middle etch stop layer 36 is less than 500 Angstroms, the combined k value of the interconnect arrangement is maintained relatively low.

Figure 8:
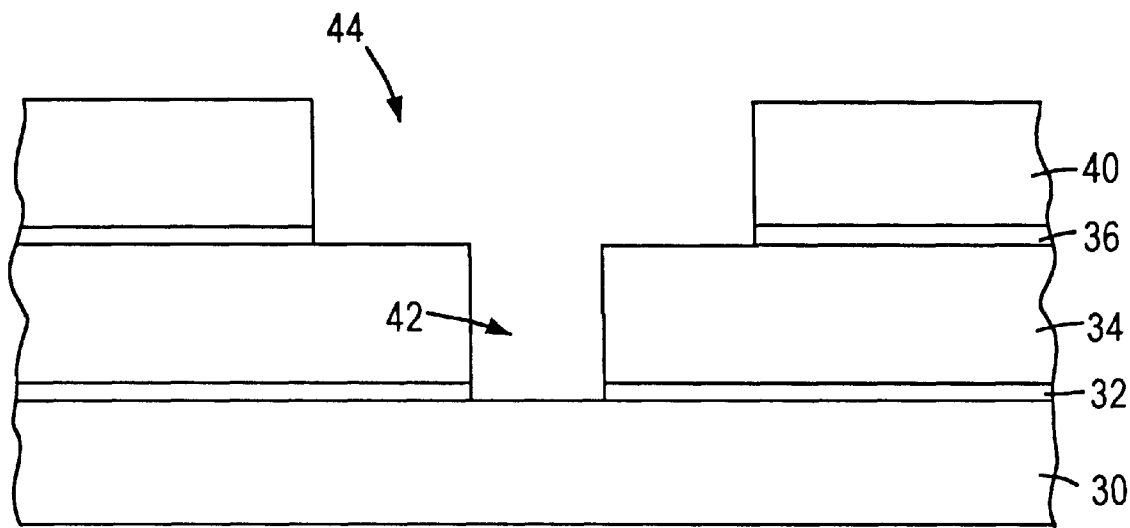
FIG. 8 depicts the structure of FIG. 7 after the bottom etch stop layer is removed from within the via pattern formed in the first dielectric layer, in accordance with embodiments of the present invention.

FIG. 8 depicts the interconnect structure of FIG. 7 after the bottom etch stop layer 32 has been etched in accordance with the via hole opening 42 in the first dielectric layer 34. A suitable etchant chemistry may be selected to remove the bottom etch stop layer 32.

Figure 9:
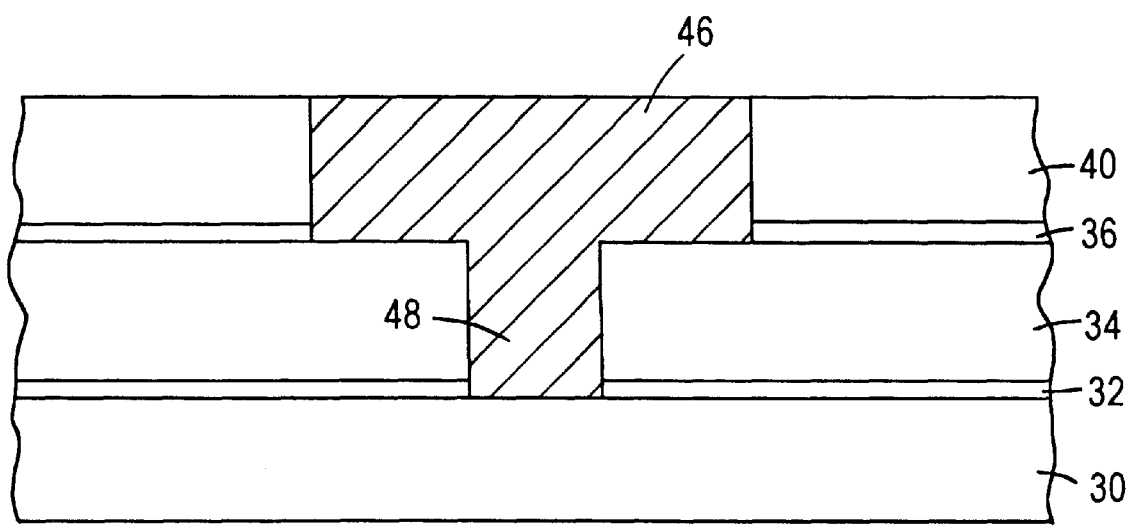
FIG. 9 shows the structure of FIG. 8 after conductive material has been deposited within the features formed in the first and second dielectric layers, in accordance with embodiments of the present invention.

Following the formation of the complete via hole 42 and trench 44, a filling and planarization process is then performed, as depicted in FIG. 9. Conductive material is deposited within the via hole opening 42 and the trench opening 44 by a simultaneous deposition process. After planarization, a conductive line 46 and a conductive via 48 are formed. In the preferred embodiments of the invention, the conductive material is copper or a copper alloy, due to the advantages provided by the use of copper. In such a case, a barrier material and a seed layer are normally provided in the trench 44 and via hole opening 42 prior to the deposition of the copper.

The structure in FIG. 9 has a low combined dielectric constant (k value) due to the ultra thin etch stop layers 32, 36 and the use of low k dielectric materials in the first and second dielectric layers 34, 40. At the same time, the etch process is improved since the materials employed in the etch stop layer are more effective etch stops than previous materials.

Although the present invention has been described and illustrated in detail, it is to be clearly understood that the same is by way of illustration and example only and is not to be taken by way of limitation, the scope of the present invention being limited only the terms of the appended claims.

What is claimed is:

1. An interconnect arrangement comprising:

a first layer;

an etch stop layer on the first layer, wherein the etch stop layer has a thickness less than approximately 500 Angstroms and comprises a material with a k value greater than the k value of silicon nitride; and a dielectric layer on the etch stop layer.

2. The interconnect arrangement of claim 1, wherein the thickness of the etch stop layer is less than approximately 200 Angstroms.

3. The interconnect arrangement of claim 1, wherein the thickness of the etch stop layer is less than approximately 100 Angstroms.

4. The interconnect arrangement of claim 1, wherein the thickness of the etch stop layer is approximately 50 Angstroms.

5. The interconnect arrangement of claim 1, wherein the etch stop layer comprises at least one of: amorphous silicon, alumina, calcium fluoride, calcium carbonate, titanium dioxide, and diamond.

6. The interconnect arrangement of claim 5, wherein the first layer comprises another dielectric layer, with one of the dielectric layers forming a via layer and the other of the dielectric layers forming a trench layer.

7. The interconnect arrangement of claim 6, wherein the via layer and the trench layer contain openings which are filled with copper or a copper alloy to form conductive vias and lines.

8. The interconnect arrangement of claim 7, wherein the dielectric layers comprise low k dielectric material.

9. The interconnect arrangement of claim 2, wherein the first layer comprises another dielectric layer, with one of the dielectric layers forming a via layer and the other of the dielectric layers forming a trench layer.

10. The interconnect arrangement of claim 2, wherein the dielectric layer contains an opening and conductive material filling the opening to form a conductive feature.

11. The interconnect arrangement of claim 10, wherein the conductive material is copper or a copper alloy.

12. The interconnect arrangement of claim 11, wherein the dielectric layer comprises a low k dielectric material.

* * * * *